(12) United States Patent
Smith

(10) Patent No.: US 8,843,083 B2
(45) Date of Patent: Sep. 23, 2014

(54) CMOS SWITCHING CIRCUITRY OF A TRANSMITTER MODULE

(75) Inventor: Malcolm Smith, San Jose, CA (US)

(73) Assignee: RF Micro Devices (Cayman Islands), Ltd., George Town (KY)

( * ) Notice: Subject to any disclaimer, the term of this patent is extended or adjusted under 35 U.S.C. 154(b) by 218 days.

(21) Appl. No.: 13/544,541

(22) Filed: Jul. 9, 2012

(65) Prior Publication Data

US 2014/0009208 A1 Jan. 9, 2014

(51) Int. Cl.
*H04B 1/44* (2006.01)

(52) U.S. Cl.
USPC .............................................. 455/78; 455/91

(58) Field of Classification Search
USPC ............ 455/333, 91, 115.1, 550.1, 78, 552.1; 327/308
See application file for complete search history.

(56) References Cited

U.S. PATENT DOCUMENTS

| | | | |
|---|---|---|---|
| 2,681,953 A | 6/1954 | Bradburd | |
| 2,797,267 A | 6/1957 | Yost, Jr. | |
| 3,151,301 A | 9/1964 | Bettin | |
| 3,287,653 A | 11/1966 | Goordman | |
| 3,441,865 A | 4/1969 | Siwko | |
| 3,524,142 A | 8/1970 | Valdettaro | |
| 3,959,603 A | 5/1976 | Nilssen et al. | |
| 4,032,973 A | 6/1977 | Haynes | |
| 4,087,761 A | 5/1978 | Fukumoto et al. | |
| 4,232,270 A | 11/1980 | Marmet et al. | |
| 4,511,857 A | 4/1985 | Gunderson | |
| 4,772,858 A | 9/1988 | Tsukii et al. | |
| 4,791,421 A | 12/1988 | Morse et al. | |
| 4,977,366 A | 12/1990 | Powell | |
| 5,023,566 A | 6/1991 | El-Hamamsy et al. | |
| 5,313,083 A * | 5/1994 | Schindler | 257/280 |
| 5,412,344 A | 5/1995 | Franck | |
| 5,521,561 A | 5/1996 | Yrjola et al. | |
| 5,589,796 A | 12/1996 | Alberth, Jr. et al. | |
| 6,060,752 A | 5/2000 | Williams | |
| 6,271,727 B1 | 8/2001 | Schmukler | |
| 6,411,098 B1 | 6/2002 | Laletin | |
| 6,696,902 B2 | 2/2004 | Lerke et al. | |
| 6,741,483 B1 | 5/2004 | Stanley | |
| 6,804,502 B2 * | 10/2004 | Burgener et al. | 455/333 |
| 6,828,862 B2 | 12/2004 | Barak | |
| 6,841,981 B2 | 1/2005 | Smith et al. | |
| 6,990,357 B2 | 1/2006 | Ellä et al. | |
| 7,003,265 B2 | 2/2006 | Jeon et al. | |
| 7,079,816 B2 | 7/2006 | Khorram et al. | |
| 7,120,399 B2 | 10/2006 | Khorram | |
| 7,138,872 B2 | 11/2006 | Blednov | |
| 7,155,252 B2 | 12/2006 | Martin et al. | |
| 7,180,373 B2 | 2/2007 | Imai et al. | |
| 7,187,945 B2 | 3/2007 | Ranta et al. | |

(Continued)

*Primary Examiner* — Sonny Trinh

(74) *Attorney, Agent, or Firm* — Withrow & Terranova, P.L.L.C.

(57) ABSTRACT

Transmit modules typically constitute passive matching circuitry, harmonic trap filters and an antenna switch to provide isolation between the transmit bands as well as between transmit and receive functions. In complementary metal-oxide semiconductor (CMOS) processes the switch function is difficult to implement as a large voltage swing may result in breakdown of the MOS oxide, drain diode, source diode as well as substrate diodes. Therefore a switching function is provided at a node that has low impedance during transmit that limits the voltage swing that the MOS switches experience. The approach is particularly useful, but not limited to, half duplex transmissions such as those used in global system for mobile (GSM) communication, enhanced data for GSM Evolution (EDGE), and time division synchronous code division multiple access (TDSCDMA).

11 Claims, 4 Drawing Sheets

(56) References Cited

U.S. PATENT DOCUMENTS

| | | |
|---|---|---|
| 7,245,887 B2 | 7/2007 | Khorram |
| 7,260,363 B1 | 8/2007 | Snodgrass |
| 7,269,441 B2 | 9/2007 | Ellä et al. |
| 7,292,098 B2 | 11/2007 | Chen et al. |
| 7,315,438 B2 | 1/2008 | Hargrove et al. |
| 7,365,605 B1 | 4/2008 | Hoover |
| 7,420,416 B2 | 9/2008 | Persson et al. |
| 7,420,425 B2 | 9/2008 | Tsai |
| 7,449,946 B1 | 11/2008 | Hoover |
| 7,468,638 B1 | 12/2008 | Tsai et al. |
| 7,623,859 B2 | 11/2009 | Karabinis |
| 7,639,084 B2 | 12/2009 | Liao et al. |
| 7,652,464 B2 | 1/2010 | Lang et al. |
| 7,663,444 B2 | 2/2010 | Wang |
| 7,768,350 B2 | 8/2010 | Srinivasan et al. |
| 7,869,773 B2 | 1/2011 | Kuijken |
| 7,890,063 B2 | 2/2011 | Ahn et al. |
| 7,920,833 B2 | 4/2011 | Qiao et al. |
| 7,924,209 B2 | 4/2011 | Kuo et al. |
| 7,948,305 B2 | 5/2011 | Shirokov et al. |
| 7,986,186 B2 | 7/2011 | Marbell et al. |
| 8,027,175 B2 | 9/2011 | Liu et al. |
| 8,368,451 B2* | 2/2013 | Mulawski et al. ............ 327/308 |
| 8,583,111 B2* | 11/2013 | Burgener et al. ............ 455/433 |
| 2003/0078011 A1 | 4/2003 | Cheng et al. |
| 2003/0193371 A1 | 10/2003 | Larson et al. |
| 2005/0052296 A1 | 3/2005 | Manlove et al. |
| 2005/0122163 A1 | 6/2005 | Chu |
| 2006/0119451 A1* | 6/2006 | Chen ............................ 333/103 |
| 2007/0008236 A1 | 1/2007 | Tillery et al. |
| 2007/0075784 A1 | 4/2007 | Pettersson et al. |
| 2008/0102762 A1 | 5/2008 | Liu et al. |
| 2008/0129642 A1 | 6/2008 | Ahn et al. |
| 2009/0073078 A1 | 3/2009 | Ahn et al. |
| 2009/0195946 A1 | 8/2009 | Kleveland |
| 2009/0296855 A1 | 12/2009 | Kitamura et al. |
| 2010/0063497 A1 | 3/2010 | Orszulak |
| 2010/0105340 A1 | 4/2010 | Weissman |
| 2010/0203922 A1 | 8/2010 | Knecht et al. |
| 2010/0321096 A1 | 12/2010 | Sudjian |
| 2011/0025408 A1 | 2/2011 | Cassia et al. |
| 2011/0074509 A1 | 3/2011 | Samavedam et al. |
| 2011/0143690 A1 | 6/2011 | Jerng et al. |
| 2011/0148521 A1 | 6/2011 | Albers et al. |
| 2011/0199146 A1 | 8/2011 | Bakalski et al. |
| 2011/0242858 A1 | 10/2011 | Strzalkowski |
| 2012/0049925 A1 | 3/2012 | Ha et al. |
| 2012/0139639 A1 | 6/2012 | Scott et al. |
| 2012/0139643 A1 | 6/2012 | Scott et al. |
| 2012/0139645 A1 | 6/2012 | Ho et al. |
| 2012/0146722 A1 | 6/2012 | Scott et al. |
| 2013/0321095 A1* | 12/2013 | Lam et al. ..................... 333/103 |

* cited by examiner

CMOS SWITCHING CIRCUITRY OF A TRANSMITTER MODULE

BACKGROUND OF THE INVENTION

1. Field of the Invention

The invention generally relates to integration of a switching function of a transmit module on bulk CMOS, and more particularly to such switching function while limiting the swing seen on the MOS transistors used by the switching function.

2. Prior Art

Transmit modules (TXMs) are increasingly the dominant front-end for GSM and EDGE phones. An exemplary TXM 100 is shown in FIG. 1. These TXMs contain power amplifiers (PAs), for example PAs 110 and 120, some (passive) matching circuitry coupled to the PAs, for example matching circuitries 130 and 140 respectively, filtering circuitry coupled to the matching circuitry, for example filtering circuitry 150 and 160 respectively, and a switching function coupled to the filtering circuitry, for example switching function 170. Typically there are two switching functions, one that switches between the transmit function and receive function (T/R switch) and another one that switches the band in multi-band phones (band switching). In most TXMs, these functions are combined in a single switch. For a quad band GSM TXM, the front-end switch 170 requires six poles. Two of these poles are used to switch the low band (LB)PA and high band (HB) PA in and out, i.e., the switch being open unless the respective PA is being used. Four switches are used to switch between the four receive (Rx) bands, i.e., open unless the particular band is selected. This puts a switch in the transmit path, this switch having to be able to handle a large voltage swing and high current. The switch will also contribute at least some power loss to the TXM 100.

In gallium arsenide (GaAs) based PAs, a separate switch is usually needed as the GaAs process used for the PA is a heterojunction bipolar transistor (HBT) process that is not suitable for making switches. In bulk complimentary metal-oxide semiconductor (CMOS), the transistors make good switches at low voltages, but at high voltages the transistors suffer from distortion and breakdown issues. Switches in TXMs are therefore usually made using GaAs pseudomorphic high electron mobility transistors (pHEMTs) or from semiconductor on insulator (SOI) CMOS which is known to be different from bulk CMOS.

Notably, the PA function has been moving away from older GaAs-based implementations, with one or two GaAs dies and a CMOS controller chip, to a single CMOS die to cover power output and control functionality. However, the switch is difficult to implement in bulk CMOS because of the large voltage swings (33 dBm into 50Ω which is 10V RMS swing) at the antenna port. The problems with the large voltage swing for a bulk CMOS process include the possibility of breakdown of the MOS oxide or drain and source diodes, as well as the reverse biased diode to substrate which can be forward biased and has a non-linear capacitor associated with it that generates unwanted harmonic interference.

In view of the deficiencies of the prior art, it would be advantageous to provide a solution that enables avoiding the need for a switch in the transmit path.

DETAILED DESCRIPTION OF THE PREFERRED EMBODIMENTS

Transmit modules typically constitute passive matching circuitry, harmonic trap filters and an antenna switch to provide isolation between the transmit bands as well as between transmit and receive functions. In complementary metal-oxide semiconductor (CMOS) processes the switch function is difficult to implement as a large voltage swing may result in breakdown of the MOS oxide, drain diode, source diode as well as substrate diodes. Therefore a switching function is provided at a node that has low impedance during transmit that limits the voltage swing that the MOS switches experience. The approach is particularly useful, but not limited to, half duplex transmissions such as those used in global system for mobile (GSM) communication, enhanced data for GSM Evolution (EDGE), and time division synchronous code division multiple access (TDSCDMA).

Figure 2:
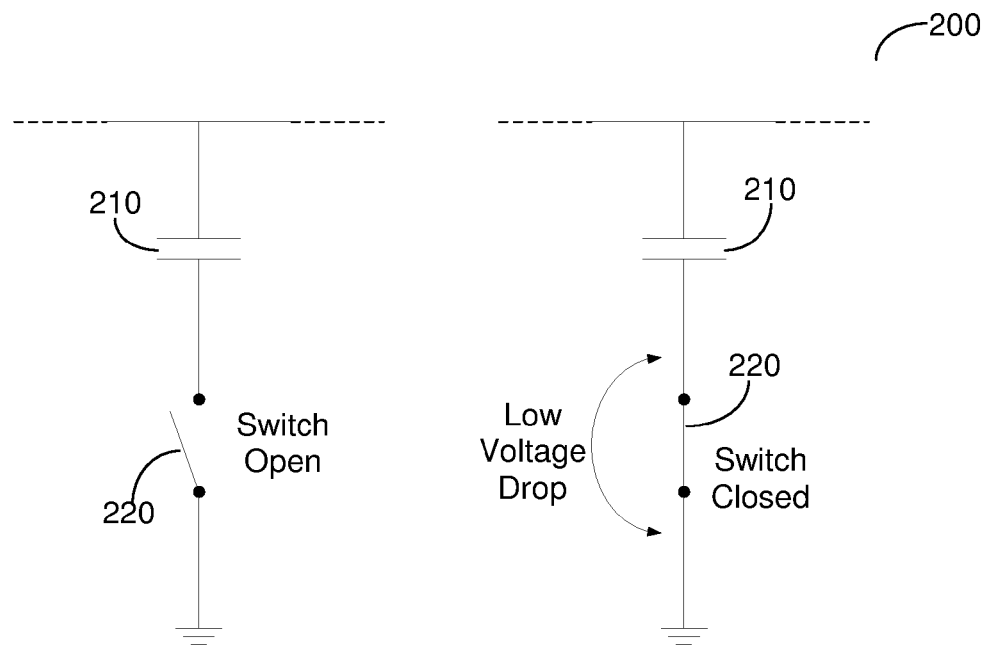
FIG. 2 is a switching circuit in open and closed modes according to an embodiment.

The challenge is therefore to avoid having a high voltage swing on the MOS switch, also referred to herein as a switch. FIG. 2 depicts and exemplary and non-limiting switching circuit 200 in open and closed modes according to an embodiment. The circuit comprises a capacitor 210 and a MOS switch 220, the switch 220 may be open (left side, i.e., having a high resistance for current conduction) or closed (right side, i.e., having a low resistance for current conduction). The switch 220 will see little voltage swing, assuming it has low impedance compared to the capacitor 210, as it ties the capacitor 220 to ground. This is particularly useful in half duplex systems, but not limited thereto, where the receiver is never active when the transmitter is active and that putting any switching function at a node that is low impedance during transmit limits the voltage swing that the MOS switches would see.

Figure 3:
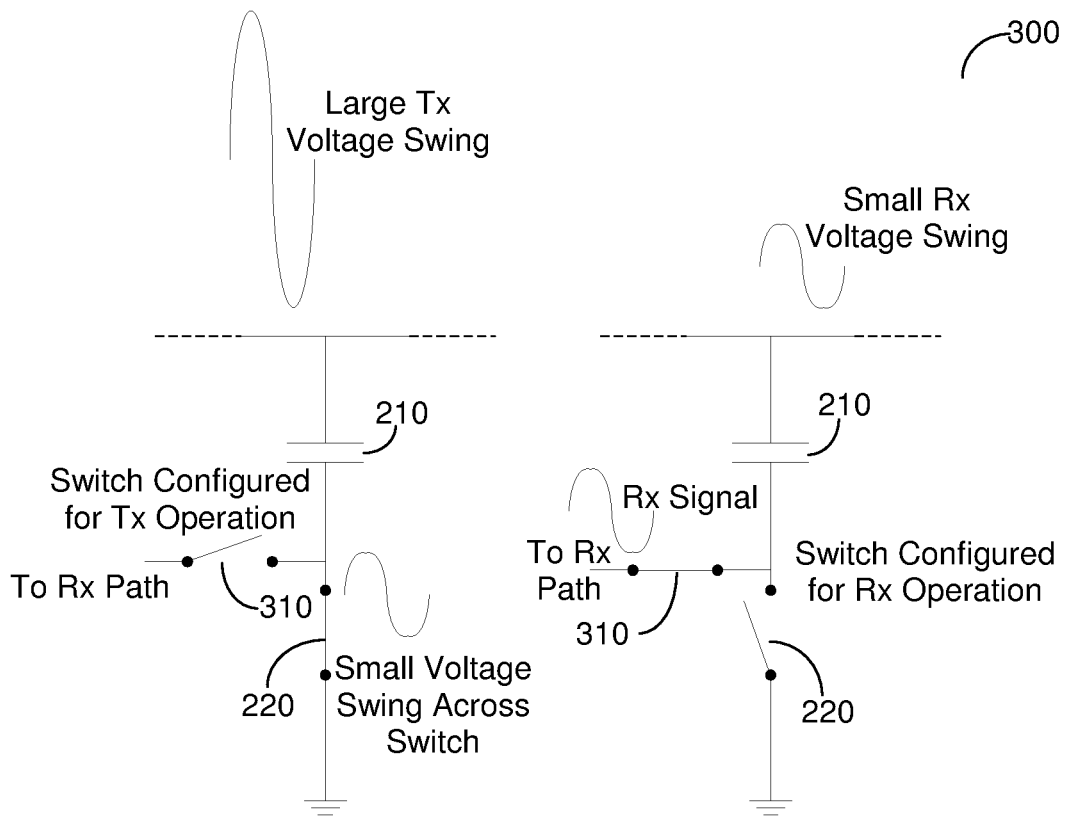
FIG. 3 is a switching circuit with switches operative for both the transmit and receive operation modes.

The operation is further illustrated with respect if FIG. 3 that depicts an exemplary and non-limiting switching circuit 300 with switches operative for both the transmit and receive operation modes. In addition to the capacitor 210 and the transmit mode switch 220 (shunt switch), a receive mode switch 310 (series switch) is further provided. The switches operate such that when switch 220 is closed then switch 310 is open (see the illustration on the left) and conversely, when switch 220 is open the switch 310 is closed (see illustration on the right). When in transmit mode, the circuit 300 is operative as shown in the illustration on the left, where there is a small voltage swing across the shunt-switch 220 and the large transmit signal does not impact that switch 220. When in receive mode, the circuit 300 is operative as shown in the illustration on the right, where the small receive voltage swing is provided over the series switch 310 to the receive path and without presenting a high-voltage swing on the shunt switch 220. One of ordinary skill in the art would readily appreciate that this configuration allows for all the functionality of the front-end switch to be implemented in bulk CMOS manufacturing processes. Although the circuit 300 is shown with a capacitor 210, it is just as possible to implement it with an inductor or a network of capacitors and inductors, hence a variety of passive networks are possible for use without departing from the scope of the invention; the only requirement is that the element or elements are shunted to ground using a MOS switch in the transmit operation. While FIG. 3 includes the receive mode switch 310 (which offers some isolation between the receive circuits and the transmit path), it should be understood by one of ordinary skill in the art that if the transmit switch is low enough in impedance there may be no need to include a receive switch. This is because the swing at the receive port during transmit operation may be low enough to be tolerable.

Figure 4:
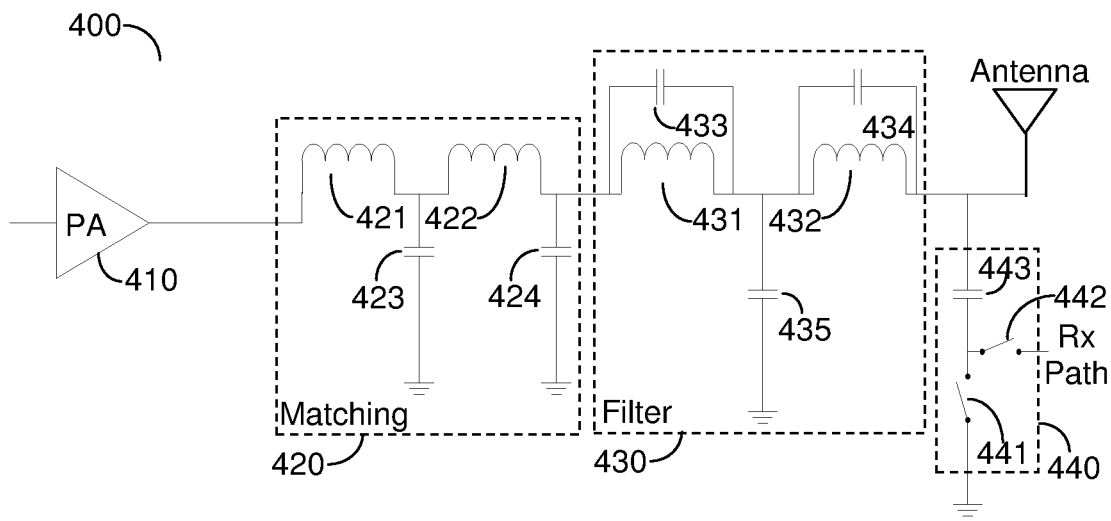
FIG. 4 is a transmit circuit ending with a switch according to one embodiment.

FIG. 4 illustrates an exemplary and non-limiting transmit circuit ending with a switch according to one embodiment. For example, and not by way of limitation, as GSM power amplifiers (PAs) 410 running off a battery require a low output load impedance to generate the level of output power required by the standard, the first element back from a 50Ω output port in the match will be a shunt element circuit (in order to lower the impedance). This means it is possible to combine the match circuit 420 (and notch filtering function 430) with the switching function 440. During the receive operation, the impedance looking back into the PA 410 must be high which means that the PA 410 output impedance needs to be controlled and also set high (ten times the impedance of the receive path would ensure negligible losses). One of ordinary skill in the art would readily realize that the matching circuit 420 and the filtering circuit 430 are merely an example of such circuits and are not intended to limit the scope of the invention.

Figure 5:
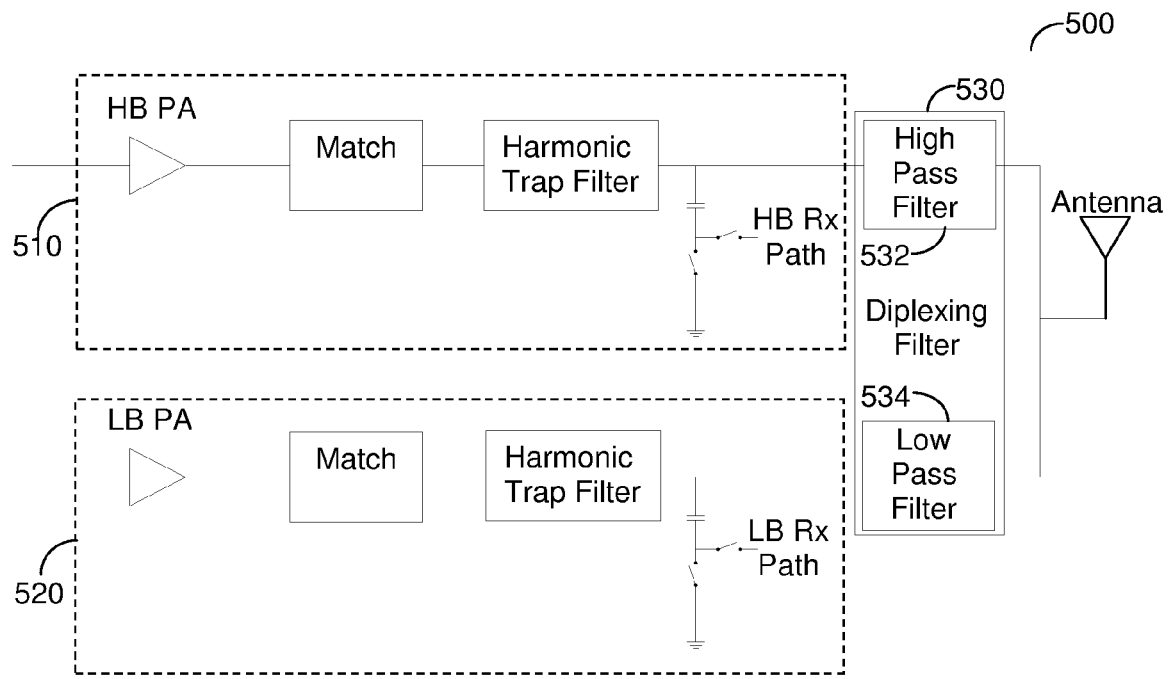
FIG. 5 is a circuit having a high-band path and a low-band path that are connected by a diplexing filter to an antenna.

FIG. 5 shows an exemplary and non-limiting circuit 500 having a high-band path 510 and a low-band path 520 that are connected by a diplexing filter 530 to an antenna. As there exists both a high-band path 510 and a low-band path 520, the diplexing filter 530 is provided so that the band that is not in use does not significantly load the band that is transmitting. Again, the impedance looking into the port that is not being driven would need to be about ten times that of the driven port to ensure negligible losses. The diplexing filter 530 comprises of one or more stages of low pass filtering 534 for the low band and one or two stages of high pass (or band pass) filtering 532 for the high band. A person of ordinary skill in the art would readily appreciate that while a two-band circuit is shown with respect of FIG. 5, this should not be viewed as limiting, and additional path may be included, each operative at separate times from the other paths.

Figure 6:
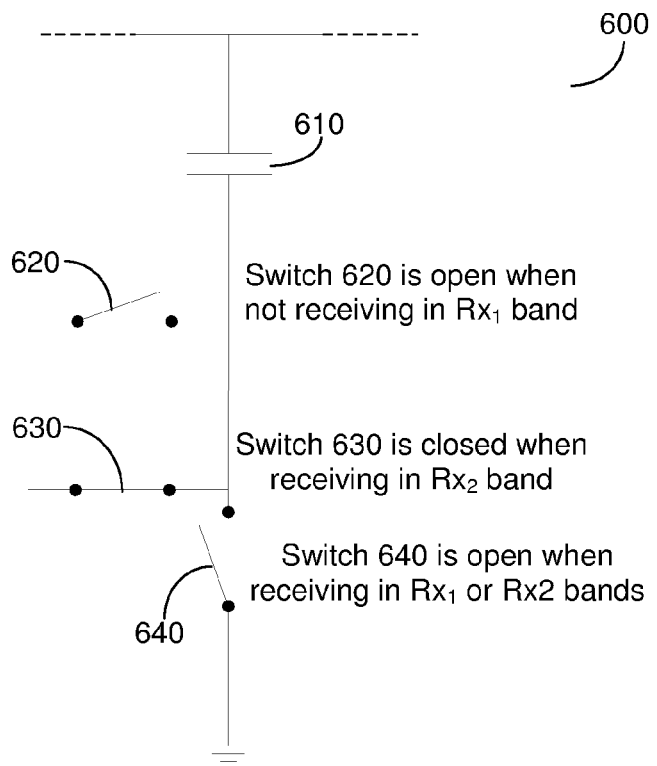
FIG. 6 is a switching circuit to support operation in more than one band according to an embodiment.
Figure 7:
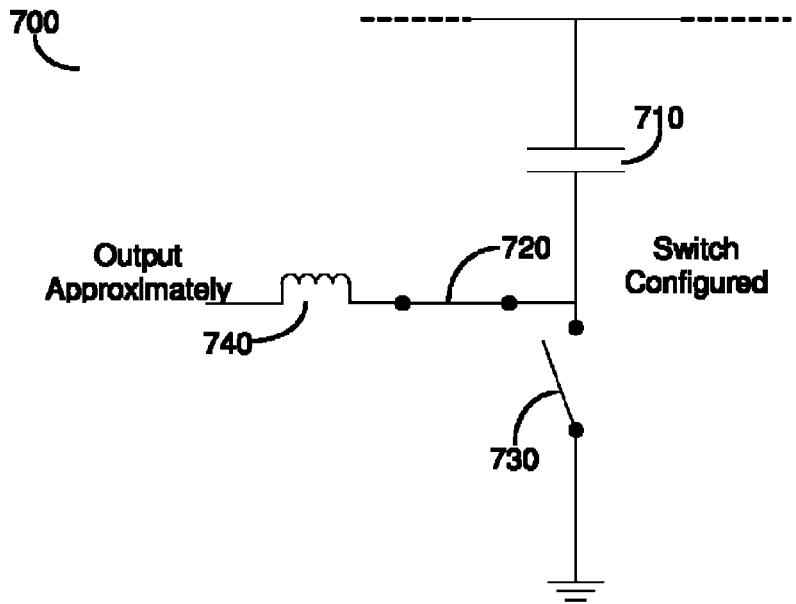
FIG. 7 is a switching circuit with an inductor in series with the series switch according to an embodiment.

FIG. 6 illustrates an exemplary and non-limiting switching circuit 600 to support operation in more than one receiving band according to an embodiment. In this case the transmit function switch 640 (the shunt switch) is shared, but the series switch (the Rx switch) is duplicated for each band, i.e., there are a first series switch 620 and a second series switch 630. While two series switches are described herein, this should not be viewed as limiting on the scope of the invention and a plurality of series switches may be used. In the exemplary and non-limiting case of a GSM transceiver support for up to four bands, two high and two low, is required. This would therefore involve a second serial receive switch in each band. FIG. 7 shows a exemplary and non-limiting switching circuit 700 with an inductor 740 in series with the series switch 720 according to an embodiment. The inductor 740 is used to tune out the capacitor 710 and lower the impedance sufficiently such that the off Tx path impedance (transmit switch 730 is off) has limited loading on the Rx path. In some embodiments the circuit 700 may need to involve more than the inductor 740.

Although it is possible to implement the scheme described hereinabove using a multilayer substrate and passive components, a preferred embodiment would integrate all the components, or a large portion thereof, on a single passive device implemented using Low Temperature Cofired Ceramic (LTCC) or even a silicon process, a so called Integrated Passive Device (IPD). In one embodiment the receive band filters can also be integrated thereon, or implemented as external Surface Acoustic Wave (SAW) filters, on the silicon substrate of the IPD along with any matching required as Bulk Acoustic Wave (BAW) filters which are compatible with silicon technology.

Figure 1:
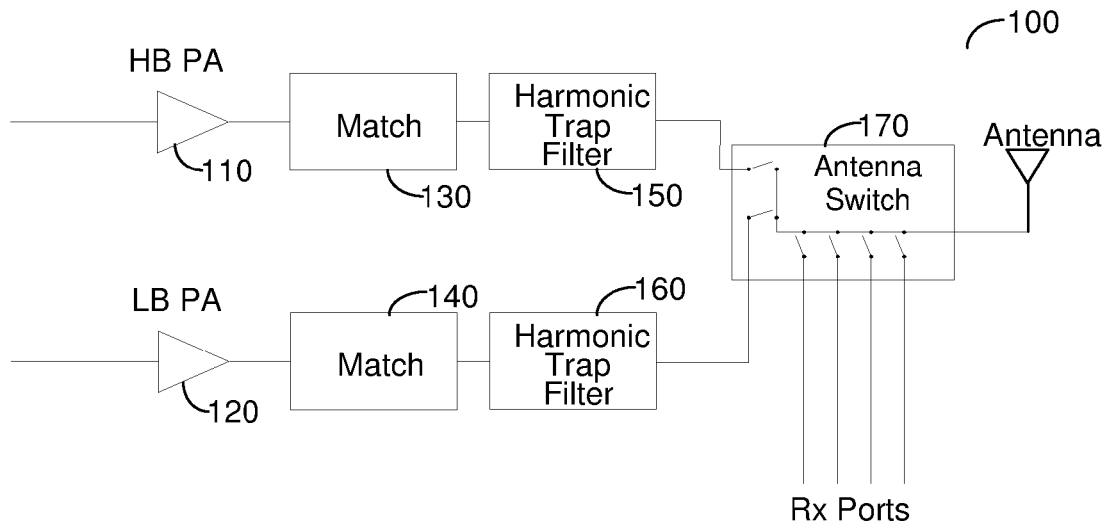
FIG. 1 is a schematic diagram of a GSM transmitter module with switches in the transmit path (prior art).
Figure 8:
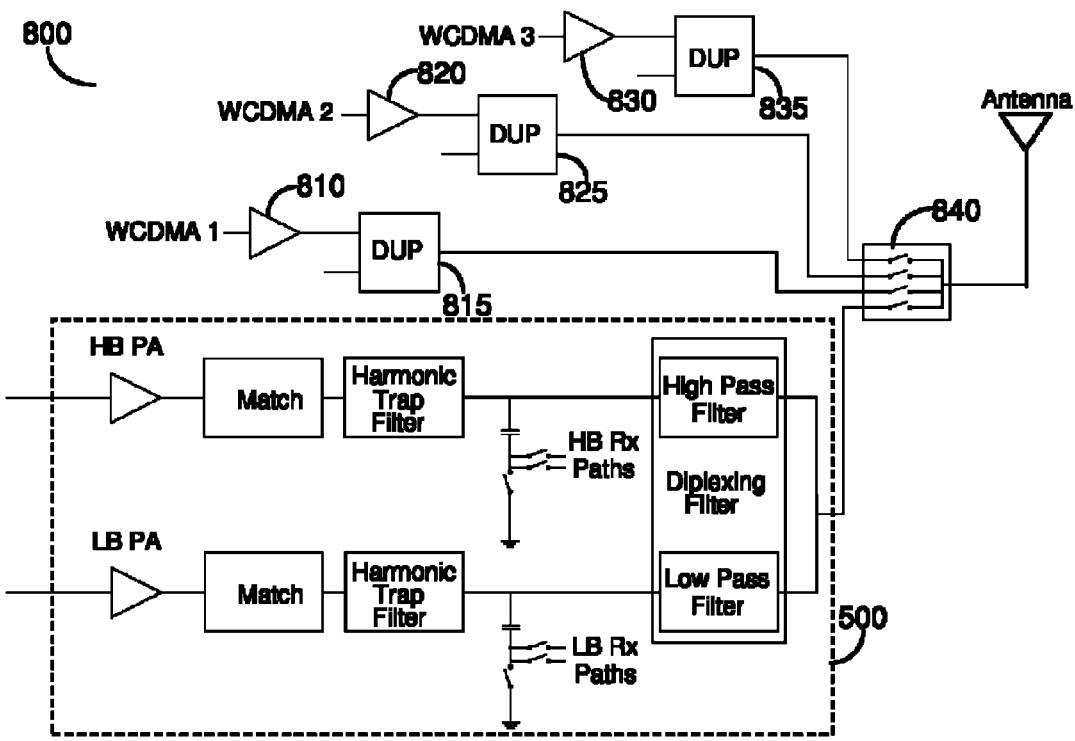
FIG. 8 is a circuit that supports 3G (WCDMA) and 4G (LTE) functionality, where 4G uses a switching circuitry embodiment.

FIG. 8 shows an exemplary and non-limiting circuit 800 that supports 3G (WCDMA) and 4G (LTE) functionality, where 4G uses a switching circuitry embodiment. A front end switch 840 is used as these standards are full duplex. However, the number of throws needed in this switch can be reduced because the GSM/EDGE channel only requires a single throw instead of four throws (dual-band), five throws (tri-band) or six throws (quad-band) of a standard front-end. This means that the tri-band 3G quad-band GSM/EDGE phone circuitry shown in FIG. 8 would require only a four throw switch (shown as switch 840) which is substantially less expensive and less of a technical challenge than the standard nine throw switch (3 WCDMA throws and 1 GSM throw). In FIG. 8 elements 810, 820 and 830 are power amplifiers similar to 110 shown in FIG. 1. DUP 815, 825, and 835 are circuits essentially similar to the circuit 500 adapted to the frequency bands of WCDMA1, WCDMA2 and WCDMA3 respectively.

While the disclosed invention is described hereinabove with respect to specific exemplary embodiments, it is noted that other implementations are possible that provide the advantages described hereinabove, and which do not depart from the spirit of the inventions disclosed herein. Such embodiments are specifically included as part of this invention disclosure which should be limited only by the scope of its claims. Furthermore, the apparatus disclosed in the invention may be implemented as a semiconductor device on a monolithic semiconductor.

What is claimed is:

1. An apparatus comprising:
   a first signal path for a first frequency band comprising a first power amplifier (PA) a first matching circuit and a first filtering circuit;
   a second signal path for a second frequency band, the second frequency band being different from the first frequency band; and
   a first switching circuit coupled to the second signal path to enable routing of a second signal from the second signal path to an antenna coupled to the apparatus such that at least a transmit switch of the first switching circuit is not subject to a transmit voltage swing.

2. The apparatus of claim 1, wherein the second signal path further comprises a second power amplifier (PA), a second matching circuit an input of which is coupled to an output of the second PA, and a second filtering circuit an input of which is coupled to an output of the second matching circuit.

3. The apparatus of claim 1, wherein the first switching circuit further comprises a shunt switch that is closed during transmit of a signal to an antenna and open during receipt of a signal from an antenna.

4. The apparatus of claim 3, wherein the shunt switch is coupled to the second signal path by means of a passive network.

5. The apparatus of claim 4, wherein the passive network comprises at least one of: a capacitor, an inductor, a network comprising at least a capacitor and at least an inductor.

6. The apparatus of claim 1, wherein the first switching circuit further comprises a series switch that is open during transmit of a signal to an antenna and closed during receipt of a signal from an antenna.

7. The apparatus of claim 1, further comprising:
 a second switching circuit coupled to the first signal path to enable routing of a first signal from the first signal path to an antenna such that at least a transmit switch of the second switching circuit is not subject to a transmit voltage swing; and
 a diplexing filter coupled to an output of the first and second signal paths, an output of the diplexing filter coupled to an antenna.

8. The apparatus of claim 7, wherein the second signal path further comprises a second PA, a second matching circuit an input of which is coupled to an output of the second PA, and a second filtering circuit an input of which is coupled to an output of the second matching circuit.

9. A circuit in a transmit module comprising:
 a passive network comprising a first node and a second node, the first node connected to an output of a signal path of the transmit module;
 a shunt switch having a first pole connected to the second node of the passive network and a second pole connected to ground; and
 a series switch having a first pole connected to the first pole of the shunt switch;
 wherein when the transmit module is in transmit mode the shunt switch is closed and the series switch is open.

10. The circuit of claim 9, wherein the passive network comprises at least one of: a capacitor, an inductor, a network comprising at least a capacitor and at least an inductor.

11. The circuit of claim 9, wherein when the transmit module is not in transmit mode the shunt switch is open and the series switch is closed.

* * * * *